United States Patent [19]

Hsieh

[11] Patent Number: 4,835,418

[45] Date of Patent: May 30, 1989

[54] THREE-STATE BIDIRECTIONAL BUFFER

[75] Inventor: Hung-Cheng Hsieh, Sunnyvale, Calif.

[73] Assignee: Xilinx, Inc., San Jose, Calif.

[21] Appl. No.: 121,542

[22] Filed: Nov. 17, 1987

[51] Int. Cl.[4] .................................... H03K 17/693
[52] U.S. Cl. .................................... 307/473; 307/242; 307/448; 307/469; 307/475
[58] Field of Search .................... 307/242–243, 307/443, 448, 465, 468, 469, 473, 475, 247 R, 272 R, 272 A; 328/103, 152

[56] References Cited

U.S. PATENT DOCUMENTS

| 4,154,978 | 5/1979 | Tu | 307/242 X |
| 4,419,592 | 12/1983 | Norgren et al. | 307/242 X |
| 4,486,753 | 12/1984 | Saeki et al. | 307/242 X |
| 4,624,006 | 11/1986 | Rempfer et al. | 307/242 X |
| 4,680,491 | 7/1987 | Yokouchi et al. | 307/242 X |
| 4,695,740 | 9/1987 | Carter | 307/475 X |
| 4,703,198 | 10/1987 | Porter et al. | 307/475 X |

FOREIGN PATENT DOCUMENTS 0077328 5/1983 Japan .................................. 307/473

OTHER PUBLICATIONS

Gaudenzi, "Bidirectional Tristate Driver", IBM T.D.B., vol. 20 No. 11A, Apr. 1978, pp. 4376–4377.

Primary Examiner—David Hudspeth
Attorney, Agent, or Firm—Skjerven, Morrill, MacPherson, Franklin & Friel

[57] ABSTRACT

A bidirectional buffer having a high impedance state is provided. This buffer is used for amplifying a signal as it is passed from one transmission line to another when it is desirable to select which direction the signal will flow. A switching circuit controls which transmission line is connected to the input terminal of the buffer and which is connected to the output terminal. A high impedance state is also provided for disconnecting the two transmission lines. Two memory cells control the direction of signal flow and the high impedance state.

19 Claims, 6 Drawing Sheets

─┼─ = ─┼─ (CROSSOVER WITHOUT POSSIBILITY OF CONNECTION)

─┼─ = ─┼─ OR ─┼─ (HORIZONTAL AND VERTICAL LINES CAN BE CONNECTED OR NOT CONNECTED)

─┼─ = ─┘ OR ─┐ OR ─┴─ (PARTIAL INTERCONNECT)

─✳─ = FULL INTERCONNECT, SEE FIG.3

= FULL INTERCHANGE, SEE FIG.4

= BIDIRECTIONAL AMPLIFIER, SEE FIGS 5 AND 6

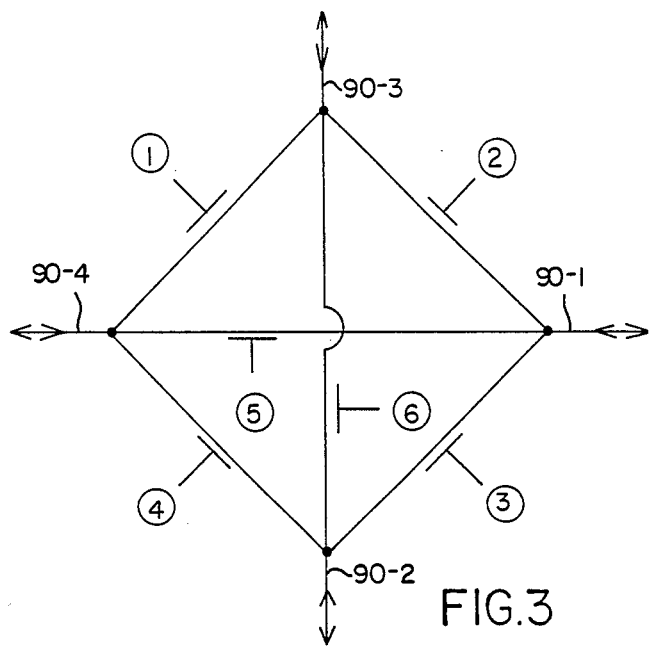
FIG.3
FIG.4
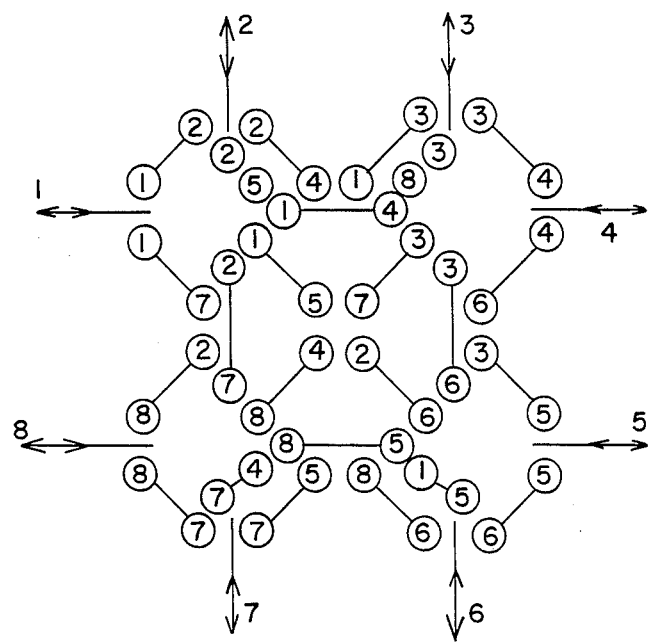

THREE-STATE BIDIRECTIONAL BUFFER

BACKGROUND OF THE INVENTION

The present invention relates to VLSI semiconductor circuits, more particularly to propagating signals on transmission lines in programmable or configurable logic arrays.

User programmable logic arrays and other programmable logic devices may comprise logic elements interspersed in an array of transmission lines. To program a device, the logic elements are configured and the transmission lines are connected together in a pattern to connect the logic elements to each other as desired. In the semiconductor chip, the transmission lines are usually formed as metal segments above a semiconductive substrate in which the logic elements are formed. In order to programmably connect one logic element to another logic element for performing a complex logic function, a transistor having its current carrying terminals permanently connected to two different transmission lines is turned on by programming a device such as a memory cell to supply the control terminal of the transistor with the proper voltage. A transmission line can also be connected to the control terminal of the transistor for controlling the connection between two other transmission lines.

Since a signal in a user programmable logic device may pass through several pass transistors or transmission gates, each of which attenuates the signal, it is periodically necessary to buffer the signal as it is passed from one transmission line to another or as it is passed on a long transmission line. Since the transmission lines are programmably connected after manufacture, it is not possible to know before manufacture the direction of the signal flow between the lines to be connected. In these situations a bidirectional buffer is provided. Copending application Ser. No. 07/013,314 describes such a bidirectional buffer and is incorporated herein by reference.

FIG. 1 shows a logic array in which bidirectional buffers (amplifiers) may be desired. FIG. 1 is an example of a 3-element by 3-element configurable logic array with 12 input/output pads and three different types of logic elements. FIG. 2 shows the legend of interconnect symbols used in FIG. 1. For example node S6-11 of FIG. 1 employs a simple programmable interconnect in which the vertical and horizontal lines may either be connected or not connected. The interconnect at node S10-11 is a full interconnect in which the vertical line may be connected or broken, and in which either of the vertical line segments adjoining node S10-11 may be connected to either of the horizontal line segments adjoining node S10-11. Node B10 employs a bidirectional amplifier or buffer which may be programmably controlled to amplify in either direction.

FIG. 3 shows a circuit diagram of a full interconnect (see legend, FIG. 2) such as S10-11 shown in FIG. 1. It can be seen from FIG. 3 that pass transistors 1 through 6 can be programmed to interconnect any combination of four bidirectional transmission lines 90-1 through 90-4 as desired. FIG. 4 shows a representation of a full interchange in which any of eight bidirectional transmission lines can be programmably connected to any other of the eight bidirectional transmission lines. In FIG. 4, interconnect lines are shown with circled numbers at their ends corresponding to the transmission lines they connect. The pass transistors are not shown in order to simplify the drawing. A complete description of the interchange of FIG. 4 is provided in application Ser. No. 07/013,314.

In FIG. 1, bidirectional amplifiers such as B10 and B24 are shown in each of the horizontal transmission lines. These bidirectional amplifiers are used on transmission lines to prevent the signal from being degraded by too many pass devices. For example, if a signal on output port OUT of logic element 40-1 is to be provided as input to input port IN1 of logic element 40-9, it may be routed through interconnects S6-11, S10-11, S10-20, S18-20 and S18-24. Each interconnect, which takes the signal through the pass transistor, adds resistance and some capacitance to the signal. In order to improve the quality of the signal, buffers such as B10 are provided to amplify and sharpen the signal.

There is a limit to how frequently buffers should be provided. Buffers cost chip space, and when used, add the propagation delay of the buffer to the total propagation time of a signal. Thus in designing a circuit, a comparison is made between the RC delay experienced by a signal when no buffer is used, and the propagation delay experienced by a signal passing through a buffer. These factors are a function of the impedance of a pass transistor channel and the capacitance of the transistor gate of the buffer and of the transmission line. In one preferred design, the ideal number of pass transistors through which a signal propagates between buffers is three to four.

FIG. 5 and FIG. 6 show two bidirectional buffers taught in copending application Ser. No. 07/013,314 and which can be used in FIG. 1 for amplifying the signal on the transmission line at locations such as B10 and B24. These buffers are connected between transmission lines A and B as controlled by pass transistors P1-P4 of FIG. 5 or Q1-Q8 of FIG. 6.

In both FIGS. 5 and 6, the bidirectional buffer is under control of a single memory cell 63. One memory cell can have only two states, "0" or "1". The single memory cell 63 of FIG. 5 controls four pass transistors. The Q output controls N-channel enhancement mode transistors P1 and P2 while the $\bar{Q}$ output controls N-channel enhancement mode transistors P3 and P4. When memory cell 63 holds a logic "1" at node Q, transistors P1 and P2 are ON, output terminal 62 of bidirectional buffer 64 is connected to transmission line A and input terminal 61 is connected to transmission line B. Transistors P3 and P4 are OFF, thus the buffer is connected to amplify a signal as it is propagated from line B to line A. The opposite state of memory cell 63 connects the buffer to amplify in the opposite direction.

The bidirectional buffer of FIG. 6 works in a similar manner, with transistor pairs such as Q1 and Q2 replacing single transistors such as P1. In FIG. 6, transistor Q1 is an N-channel transistor and transistor Q2 is a P-channel transistor. A high signal from the Q output terminal of memory cell 63 turns on transistor Q1 at the same time as a low signal from the $\bar{Q}$ output terminal of memory cell 63 turns on transistor Q2. Likewise, each of the other pairs of transistors is connected so that the transistors in the pair operate together. Operation of these buffers is explained more fully in copending application Ser. No. 07/013,314.

As controlled by single memory cell 63, the buffers of FIG. 5 and FIG. 6 do not have a high impedance state, that is, a state in which lines A and B are not connected. This condition of being always ON can create a problem during configuration of a logic array such as that of FIG. 1. Configuration consists of loading the appropriate data into the memory cells controlling the pass transistors and buffers of the configurable logic array. A voltage is usually present on some of the transmission lines during configuration of the programmable elements and interconnects because the same power supply which provides power for programming is preferably used to provide power to the logic array during operation. During programming, it is not always possible to prevent buffer output leads from being temporarily connected to each other.

Memory cells can be initially set or reset such that all bidirectional buffers point in the same direction, for example in FIG. 1, setting the output leads of all buffers such as B10 and B24 in horizontal lines to point to the right. This will reduce but not eliminate the chance of buffer output leads being temporarily connected to each other during the configuration process.

Connecting one buffer output to another will occur when some buffers have been set to the final direction and other buffers have not yet been set. The simplest order of programming the controls is not related to the values to be programmed on the controls. Layout of the memory cells controlling the various pass transistors and buffers locates the buffers and memory cells in a somewhat random order with respect to each other. Cells for controlling buffers are intermixed with cells for controlling pass transistors. It is not convenient to program all buffers before programming any pass transistors.

Consider the following example in which buffer output terminals are temporarily connected together.

Let us assume that the bidirectional buffers including buffers B10 and B24 of FIG. 1 have been initially set so that their output directions point right, and that a user wishes to connect output lead OUT of element 40-1 to input leads IN1 of both elements 40-8 and 40-9. The selected route will be through interconnects S6-11, S10-11, S10-20, S18-20, and both S18-16 and S18-24. Among other interconnects to be programmed in the logic array, the memory cell controlling interconnect S6-11 will be set so that S6-11 is ON. Interconnect S10-11 will be configured so that line Y11a is connected to line X10b. Buffer B10 connects line X10b and line X10c together and it remains directed so that its output port points to the right and its input port points to the left. Interconnect S10-20 will be configured so that line X10c is connected to line Y20b. Interconnect S18-16 will be configured so that input port IN1 of logic element 40-8 is connected to line X18b. Buffer B24 will be redirected so that its output port points to the left, and its input port points to the right. Interconnect S18-20 will be configured so that both line X18c and line X18d are connected to line Y20b. And interconnect S18-24 is configured so that line X18d is connected to input port IN1 of element 40-9.

Let us assume that because of the layout of the components interconnects S10-20 and S18-20 are programmed before buffer B24 is reoriented. In this interim period, the outputs of buffers B10 and B24 are connected together through lines X10c, Y20b, and X18c. In this interim period if a high signal is applied to the input lead of buffer B10 and a low signal is applied to the input lead of buffer B24, there will be a short circuit from the supply voltage to ground through the two buffers. Such a high current situation can cause drooping of the power supply voltage with a resultant improper programming of subsequent memory cells. It is also possible that such a high current could damage or destroy the chip during programming.

Many other examples can be imagined in which additional care must be taken to avoid creating such shorts.

One way to avoid such shorts with the current buffers is to program the directions of all buffers before turning on any pass transistors to interconnect elements of the array. However, it is not efficient to program all memory cells for bidirectional buffers before turning on any pass transistors. To orient all buffers before turning on any pass transistors requires extra circuitry to program in a random access fashion rather than moving sequentially from one side of the chip to the other, which in turn requires larger chip size. It is preferable to use a simpler algorithm.

SUMMARY OF THE INVENTION

This invention provides a three-state buffer having, in addition to first and second states in which a buffer amplifies in first and second directions, an OFF, or high impedance, state in which adjacent line segments are disconnected. With the buffers of this invention, a configurable array can be configured in any order with no concern for conflict between buffers. Providing this OFF state in buffers located in a transmission line makes a further improvement by reducing the capacitance encountered by a signal using the line to reach its destination because unused portions of the line can be disconnected so that the effective line length is shorter.

Additionally, using a buffer with a high impedance state as a switch, and thus disconnecting two portions of a transmission line allows the two portions to be used separately for routing two separate signals, as was achieved with the full interconnect described above.

A further advantage of providing a buffer with a high impedance state is that in addition to being placed in a transmission line, it can be used to interconnect crossing lines so that some buffers in the transmission lines themselves may not be needed.

The three-state buffer of this invention uses two memory cells to control the state of the buffer, and thereby achieves three operating states, one where a signal on a first transmission line is amplified and transferred to a second transmission line, a second state in which a signal on the second line is amplified and sent to the first line, and a third or high impedance state in which the two lines are not connected. Two memory cells control the buffer to occupy one of these three states. In one embodiment a first memory cell controls the direction of transmission, as with the prior art circuit described above, while a second memory cell enables the buffer. In a preferred embodiment a first memory cell enables the three-state buffer to transmit a signal in a first direction of transmission and a second memory cell enables the three-state buffer to transmit a signal in a second direction. The first and second memory cells also control connection of the buffer input terminal to a voltage supply so that when the buffer is not to transmit a signal in either direction, the buffer input does not float to an intermediate state with resulting high current.

BRIEF DESCRIPTION OF THE DRAWINGS

FIG. 3 shows a circuit diagram of a full interconnect shown in FIG. 1.

FIG. 4 shows a representation of a full interchange in which any of eight transmission lines can be programmably connected to any other of the eight transmission lines.

DETAILED DESCRIPTION

Figure 5:
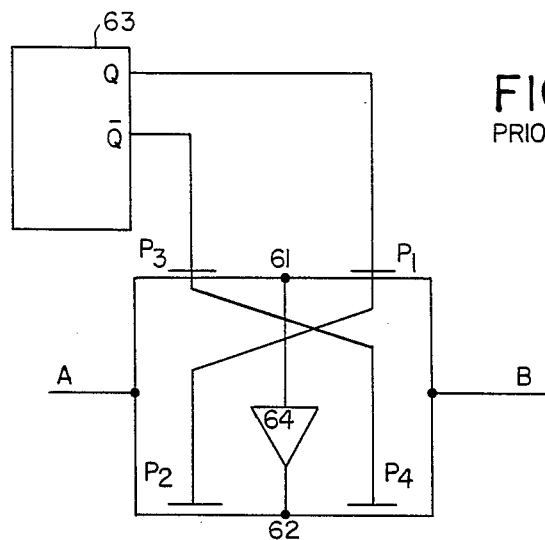
FIG. 5 and FIG. 6 show circuit diagrams of two bidirectional buffers taught in copending application Ser. No. 07/013,314.
Figure 8:
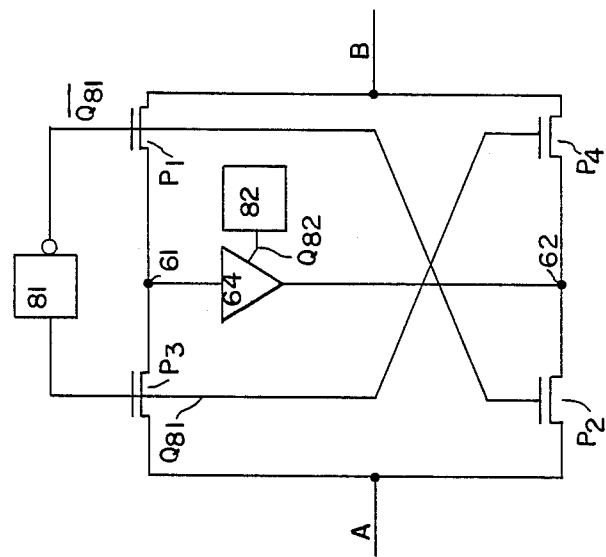
FIG. 8 shows a circuit diagram of another embodiment of the bidrectional buffer of this invention.

FIG. 8 shows a bidirectional buffer similar to that shown in FIG. 5. Components of FIG. 8 which are like those of FIG. 5 are given the same reference numerals. Unlike FIG. 5, two memory cells 81 and 82 control the state of the bidirectional buffer circuit rather than single memory cell 63. Memory cell 81 controls the direction of the buffer, as does memory cell 63 of FIG. 5. In addition, buffer 64 is provided with an enable control from memory cell 82 through output line Q82. Memory cell 82 is initially set before programming to place buffer 64 into a high impedance state. If the buffer of FIG. 8 were used as buffer B10 and B24 of FIG. 1, in the example discussed above, turning on programmable interconnects S10-20 and S18-20 before reorienting buffer B24 would not cause a short to develop between supply and ground voltages because a high impedance would be present at the output terminal of buffer B24. And, of course, if buffer B24 were reoriented before turning on interconnects S10-20 and S18-20, no short would develop between the two buffers because their output terminals would not be connected together.

There is the possibility, however, that if enable memory cell 82 is turned on before orientation memory cell 81, a short may exist as in the prior art circuits. This problem can be made not to occur because controls of the same buffer can be physically located to allow memory cell 81 to be programmed before memory cell 82 is programmed. In order to avoid this restriction however, another embodiment is preferred.

Figure 7:
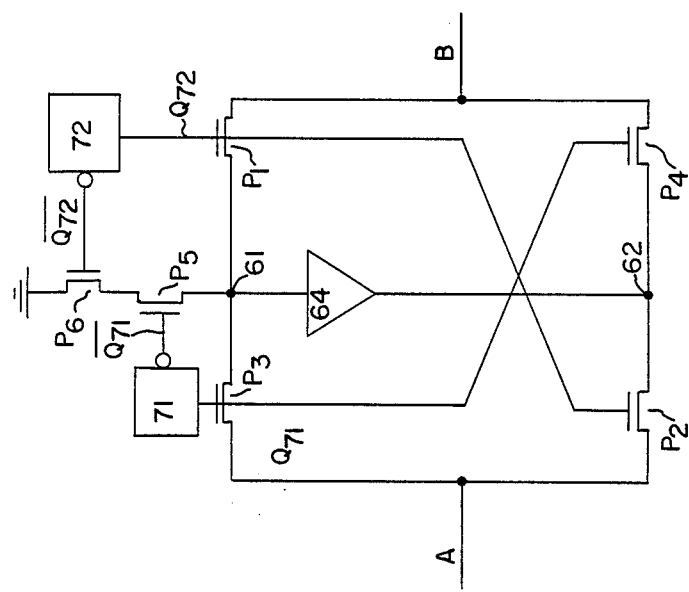
FIG. 7 shows a circuit diagram of one embodiment of the bidirectional buffer of this invention.

FIG. 7 shows this preferred embodiment of a three-state bidirectional buffer of the present invention. Components of FIG. 7 which are like those of FIG. 5 are given the same reference numerals. Two memory cells 71 and 72 control the state of the bidirectional buffer circuit. When both memory cells 71 and 72 hold a logic "0" the four transistors P1, P2, P3, and P4 are OFF while transistors P5 and P6, which are controlled by the inverting output signals from memory cells 71 and 72 respectively are ON. Since all four transistors P1-P4 are OFF, the buffer circuit provides a high impedance between transmission lines A and B. Since memory cells P5 and P6 are both ON, the input terminal of buffer 64 is connected to ground so as to prevent a floating buffer input, which in some buffer designs could result in high current.

When either of memory cells 71 and 72 is brought to a logic "1" level, the input terminal 61 of buffer 64 is disconnected from ground. In the case when memory cell 71 is logic "1" and memory cell 72 is logic "0", transistors P3 and P4 are ON while transistors P1 and P2 are OFF. In this condition, the buffer circuit connects input terminal 61 of buffer 64 to transmission line A and the output terminal 62 of buffer 64 to transmission line B. On the other hand, when memory cell 72 holds a logic "1", and memory cell 71 holds a logic "0", transistors P1 and P2 are ON so the input terminal 61 of buffer 64 is connected to transmission line B, and the output terminal 62 of buffer 64 is connected to transmission line A. Thus the circuit of FIG. 7 can be programmed to provide a high impedance between transmission lines A and B, to amplify a signal propagating from line A to line B, or to amplify a signal propagating from line B to line A.

The buffer is preferably set to a high impedance (both memory cells holding a logic "0") initial condition so that when the logic array is programmed, the buffer never passes through a condition in which two buffer outputs are connected but moves directly to its intended orientation.

Memory cells 71 and 72 are never programmed to both hold a logic "1" level, as this condition would produce an "illegal" state, with input and output terminals of buffer 64 shorted together and connected to both transmission lines.

Figure 1:
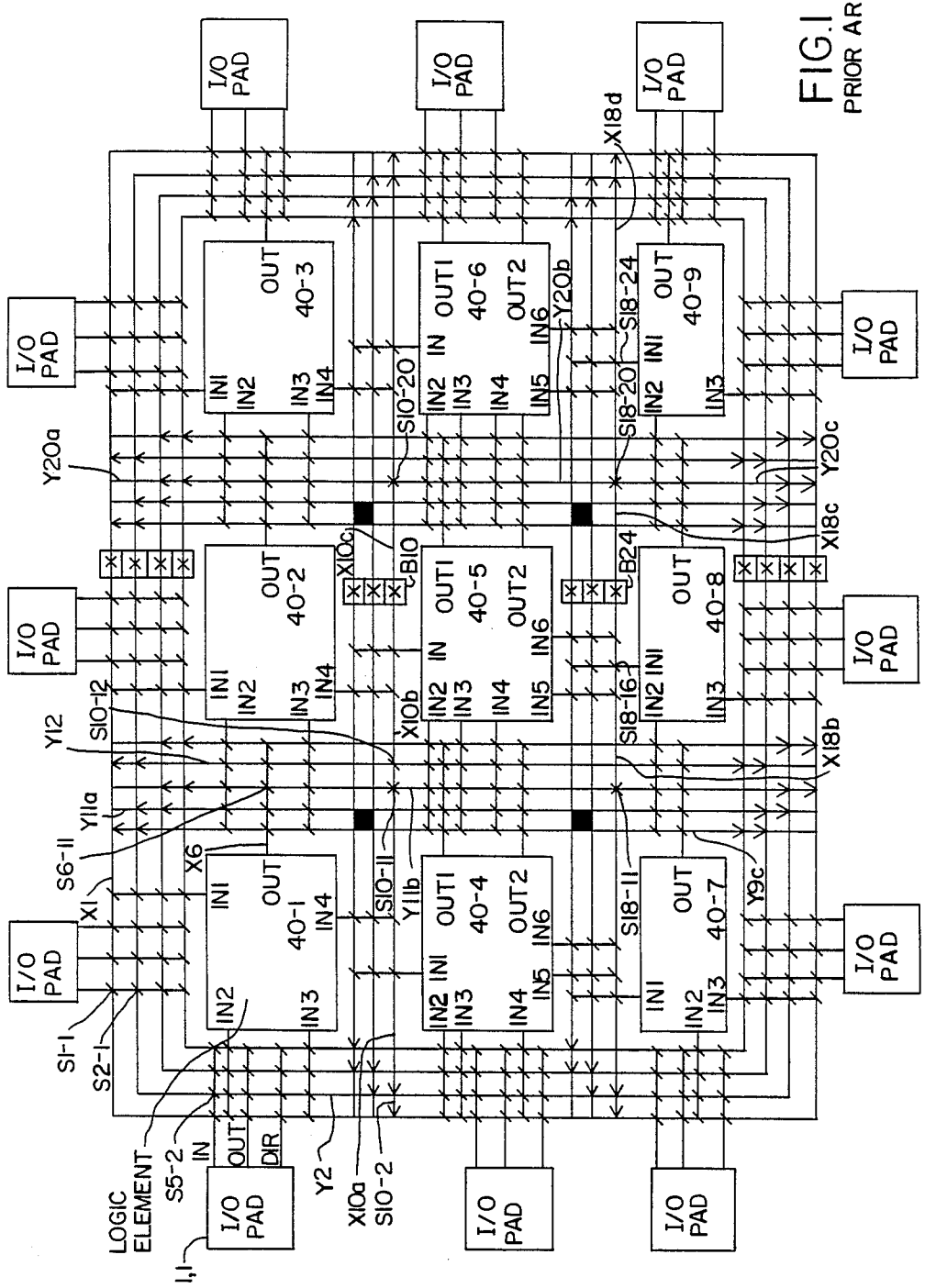
FIG. 1 shows a logic array in which bidirectional buffers may be desired.
Figure 2:
FIG. 2 shows the legend of interconnect symbols used in FIG. 1.
Figure 2:

The buffer of this invention can be used for connecting transmission lines as buffer B24 is used in FIG. 1 to connect lines X18b and X18c. Additionally the buffer of this invention can be used to programmably interconnect lines as switch S10-12 is used to interconnect line X10b to line Y12. In an array which always uses bidirectional buffers to connect a high capacitance line to another high capacitance line, it may not be necessary to also have buffers in the line.

Figure 9:
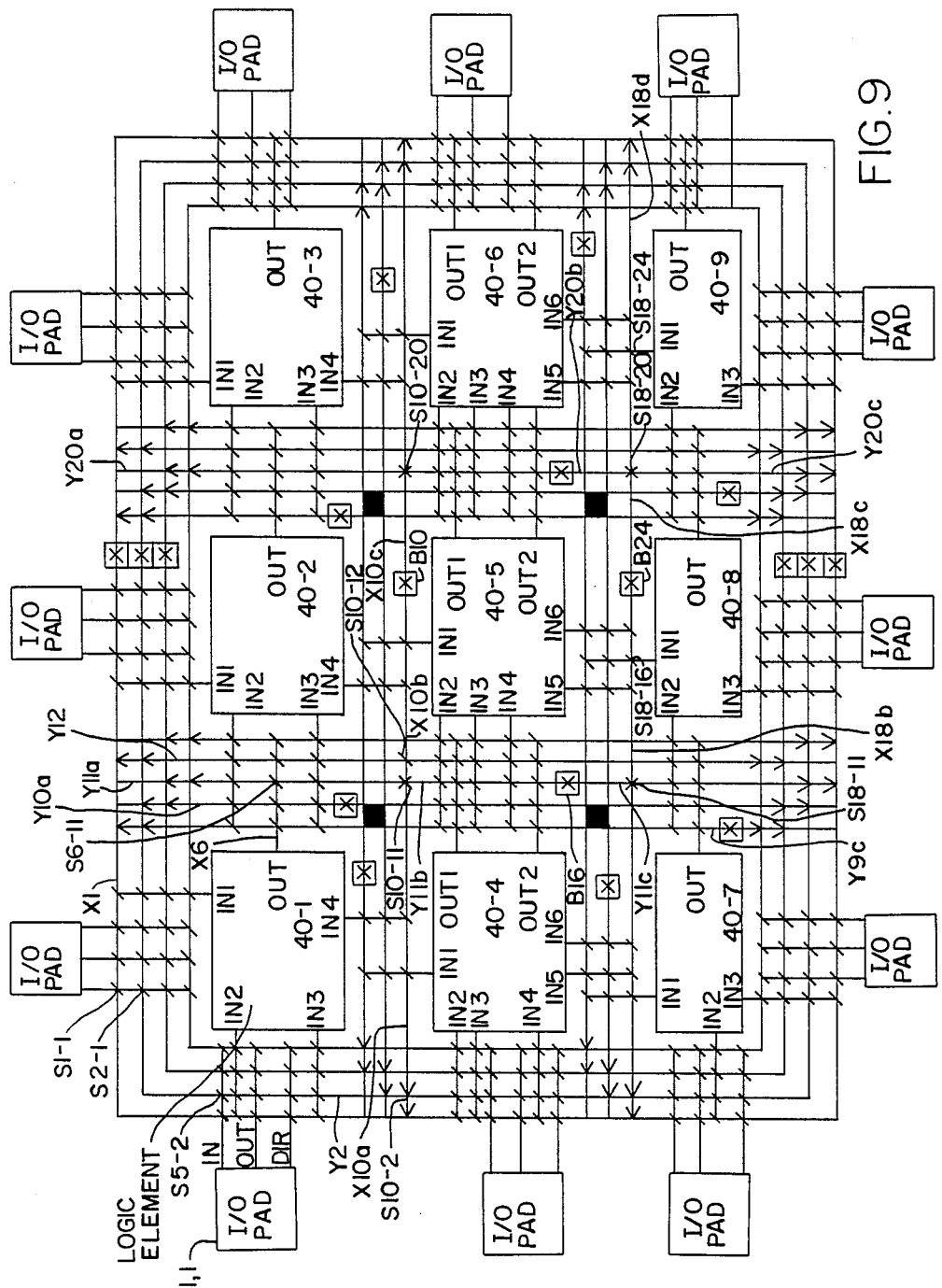
FIG. 9 shows a logic array in which bidirectional buffers are alternately provided so as to be usable when needed.

In routing a signal from origin to destination, there is a need for flexibility in selecting where in the transmission path a buffer will be used. FIG. 9 shows a buffer arrangement providing the flexibility of parallel transmission lines, in which bidirectional buffers are distributed more evenly around the chip than in FIG. 1, and in which at least one of a group of parallel transmission lines includes a three-state bidirectional buffer, while at least one other line in the group has no buffer. A switching arrangement such as that shown in FIG. 4 can implement the choice of connecting between an origin and a destination either through or not through a buffer. Determination of how frequently to use a buffer depends on the characteristics of the signal path. The criterion is to minimize the propagation time of a signal.

To appreciate the advantage of this buffer layout, consider the FIG. 1 example in which it is desired to route a signal from input/output pad 1,1 to terminal IN1 of logic element 40-8. This signal can be routed from line IN of pad 1,1 through switch S5-2 onto line Y2, through switch S10-2 onto line X10a, through switch S10-11 onto line Y11b, through switch S18-11 onto line X18b, and through switch S18-16 to input port IN1 of logic element 40-8. This is a total of five switches through which the signal must pass without being buffered.

Alternatively, because the above route may degrade the signal too much, the signal may have to be routed from input port IN of I/O pad 1,1 through switch S5-2, onto line Y2, through switch S10-2 onto line X10a, through switch S10-11 straight onto line X10b, through buffer B10 onto line X10c, through switch S10-20 onto line Y20b through switch S18-20 onto line X18c, through buffer B24 onto line X18b, and through switch S18-16 into input port IN1 of logic element 40-8. This routing may be acceptable because the signal passes through only three switches before being buffered by buffer B10, but the signal then encounters a second buffer B24 after passing through only two additional switches. Furthermore, the signal path is longer by three additional gates.

With the buffer layout of FIG. 1, it is not possible to select a path from I/O pad 1,1 to port IN1 of logic element 40-8 having the optimum number of buffers, namely one.

By contrast, in FIG. 9, because the buffers are more evenly distributed, and because there is a choice on adjacent lines of whether to use a buffer, it is possible to locate more than one path from I/O pad 1,1 to logic element 40-8 in which there is a single buffer. In FIG. 9, the buffers are located on segmented lines such as Y10a, Y11b, and Y9c which are broken by interconnects or interchanges. Lines such as Y12 are not segmented and do not need buffers. They are preferably used for clock signals. In the embodiment of FIG. 9, the signal can begin on the same route, propagating from input port IN of I/O pad 1,1 through switch S5-2, onto line Y2, through switch S10-2 onto line X10a through switch S10-11 onto line Y11b through buffer B16 onto line Y11c, through switch S18-11 onto line X18b, and finally through switch S18-16 into input port IN1 of logic element 40-8. Alternative routes having the same number of gates and also having one buffer well placed can be determined by looking at the figure.

Figure 6:
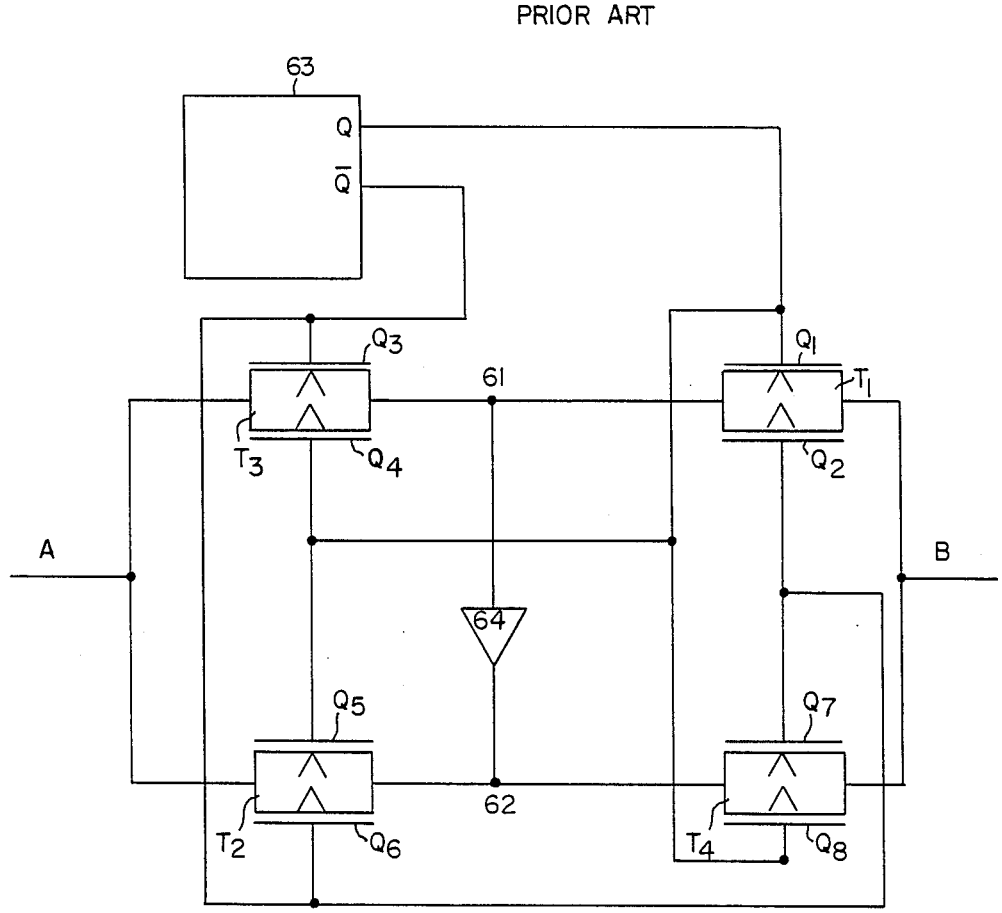

While the above description shows how to make and use several preferred embodiments of the three-state buffer of this invention, other embodiments will become obvious to those skilled in the art in light of this disclosure. For example, the transistor pairs shown in FIG. 6 can replace the single transistors of FIGS. 7 and 8. Likewise, although FIGS. 7 and 8 use N-channel transistors, it is obvious that a similar circuit using P-channel transistors could also be provided. And whereas FIG. 7 shows input lead 61 of buffer 64 connected through transistors P5 and P6 to ground, it is obvious that in order to prevent a floating gate, lead 61 could also be connected to a positive supply voltage. Such other embodiments are intended to fall within the scope of this invention.

I claim:

1. A three-state bidirectional buffer circuit for connecting a first transmission line to a second transmission line, said buffer circuit comprising:
    a buffer having an input terminal and an output terminal;
    first means for connecting said input terminal of said buffer to said first transmission line and simultaneously connecting said output terminal of said buffer to said second transmission line; and
    second means for connecting said input terminal of said buffer to said second transmission line and simultaneously connecting said output terminal of said buffer to said first transmission line;
    thereby providing that said buffer circuit may propagate a signal from said first transmission line to said second transmission line, may propagate a signal from said second transmission line to said first transmission line and may provide a high impedance to said first and second transmission lines when neither said first means nor said second means are operative to connect said first transmission line to said second transmission line.

2. A three-state bidirectional buffer circuit as in claim 1 in which said first means comprises
    a first pass transistor having a first current carrying terminal connected to said first transmission line and a second current carrying terminal connected to said input terminal of said buffer;
    a second pass transistor having a first current carrying terminal connected to said second transmission line and a second current carrying terminal connected to said output terminal of said buffer;
    a first memory cell having its noninverting output lead connected to control terminals of said first and second pass transistors.

3. A three-state bidirectional buffer circuit as in claim 2 further comprising means for connecting said input terminal of said buffer to a supply voltage and in which said first memory cell causes said input terminal of said buffer to be disconnecting from said supply voltage when said first memory cell causes said first and second pass transistors to be ON.

4. An array of transmission lines using three-state bidirectional buffer circuits as in claim 1.

5. An array of transmission lines as in claim 4 in which said transmission lines are located in groups within said array, and said three-state bidirectional buffer circuits are located within at least one of said groups such that if one of said three-state bidirectional buffer circuits is used on one of said transmission lines within said at least one of said groups, there is at least one other transmission line within said at least one of said groups which does not use a bidirectional buffer circuit.

6. A three-state bidirectional buffer circuit for connecting a first transmission line to a second transmission line, said buffer circuit comprising:
    a buffer having an input terminal and an output terminal;
    first means for connecting said input terminal of said buffer to said first transmission line and simultaneously connecting said output terminal of said buffer to said second transmission line;
    second means for connecting said input terminal of said buffer to said second transmission line and simultaneously connecting said output terminal of said buffer to said first transmission line; and
    third means for connecting said input terminal of said buffer to a supply voltage when neither of said first and second means for connecting are connecting.

7. A three-state bidirectional buffer circuit as in claim 2 in which said first means for connecting is controlled by means for providing an output signal from a first memory cell, said second means for connecting is controlled by means for providing an output signal from a second memory cell, and said third means for connecting is controlled by means for providing complements of said output signals from said first and second memory cells.

8. A three-state bidirectional buffer circuit as in claim 6 in which said supply voltage is ground.

9. A three-state bidirectional buffer circuit for connecting a first transmission line to a second transmission line, said buffer circuit comprising:
    a buffer having an input terminal and an output terminal;
    first means for connecting said input terminal of said buffer to said first transmission line and simultaneously connecting said output terminal of said buffer to said second transmission line; and second means for connecting said input terminal of said buffer to said second transmission line and simultaneously connecting said output terminal of said buffer to said first transmission line in which said second means comprises:
a first pass transistor having a first current carrying terminal connected to said second transmission line and a second current carrying terminal connected to said input terminal of said buffer;
a second pass transistor having a first current carrying terminal connected to said first transmission line and a second current carrying terminal connected to said output terminal of said buffer; and
a memory cell having its noninverting output lead connected to control terminals of said first and second pass transistors;
thereby providing that said buffer circuit may propagate a signal from said first transmission line to said second transmission line, may propagate a signal from said second transmission line to said first transmission line and may provide a high impedance to said first and second transmission lines when neither said first means nor said second means are operative to connect said first transmission line to said second transmission line.

10. A three-state bidirectional buffer circuit as in claim 9 further comprising means for connecting said input terminal of said buffer to a supply voltage in which said memory cell causes said input terminal of said buffer to be disconnected from said supply voltage when said memory cell causes said first and second pass transistors to be ON.

11. A three-state bidirectional buffer circuit for connecting a first transmission line to a second transmission line, said buffer comprising:
a buffer having an input terminal and an output terminal;
first means for selecting between a first state in which said input terminal of said buffer is connected to said first transmission line and said output terminal of said buffer is connected to said second transmission line and a second state in which said input terminal of said buffer is connected to said second transmission line and said output terminal of said buffer is connected to said first transmission line; and
second means for selecting between one of said first and second states as selected by said first means for selecting and a third state in which said buffer is in a high impedance state;
thereby providing that said buffer circuit may propagate a signal from said first transmission line to said second transmission line, may propagate a signal from said second transmission line to said first transmission line and may provide a high impedance to said first and second transmission lines when said second means selects said third state.

12. A three-state bidirectional buffer circuit as in claim 11 in which said first means for selecting comprises:
a first transistor having its current carrying terminals connected between said input terminal of said buffer and said first transmission line;
a second transistor having its current carrying terminals connected between said output terminal of said buffer and said second transmission line;
a third transistor having its current carrying terminals connected between said input terminal of said buffer and said second transmission line;
a fourth transistor having its current carrying terminals connected between said output terminal of said buffer and said first transmission line;
control means which in said first state simultaneously turns ON said first and second transistors and turns OFF said third and fourth transistors and in said second state simultaneously turns OFF said first and second transistors and turns ON said third and fourth transistors.

13. A three-state bidirectional buffer circuit as in claim 12 in which said control means comprises a memory cell having a non-inverting output lead connected to gates of said first and second transistors and an inverting output lead connected to gates of said third and fourth transistors.

14. A three-state bidirectional buffer circuit as in claim 11 in which said second means for selecting comprises means for causing said buffer to conduct for selecting one of said first and second states, and causing said buffer not to conduct for selecting said third state.

15. An array of transmission lines using three-state bidirectional buffer circuits as in claim 11.

16. An array of transmission lines as in claim 15 in which said transmission lines are located in groups within said array, and said three-state bidirectional buffer circuits are located within at least one of said groups such that if one of said three-state bidirectional buffer circuits is used on one of said transmission lines within said at least one of said groups, there is at least one other transmission line within said at least one of said groups which does not use a bidirectional buffer circuit.

17. A three-state bidirectional buffer circuit for connecting a first transmission line to a second transmission line, said buffer circuit comprising:
a buffer having an input terminal and an output terminal;
first means for selecting between a first state in which said input terminal of said buffer is connected to said first transmission line and said output terminal of said buffer is connected to said second transmission line and a second state in which said input terminal of said buffer is connected to said second transmission line and said output terminal of said buffer is connected to said first transmission line; and
second means for selecting between one of said first and second states as selected by said first means for selecting and a third state, in which said second means for selecting causes said buffer to conduct for selecting one of said first and second states and causes said buffer not to conduct for selecting said third state;
thereby providing that said buffer circuit may propagate a signal from said first transmission line to said second transmission line, may propagate a signal from said second transmission line to said first transmission line and may provide a high impedance to said first and second transmission lines when said second means selects said third state;
in which said second means for selecting comprises a memory cell.

18. An array of transmission lines using three-state bidirectional buffer circuits in which said transmission lines are located in groups within said array, and within each said group at least one of said transmission lines employs said three-state bidirectional buffer circuits and at least one of said transmission lines does not employ said three-state bidirectional buffer circuits, each of said three-state bidirectional buffer circuits comprising:

a buffer having an input terminal and an output terminal;

first means for connecting said input terminal of said buffer to said first transmission line and simultaneously connecting said output terminal of said buffer to said second transmission line; and second means for connecting said input terminal of said buffer to said second transmission line and simultaneously connecting said output terminal of said buffer to said first transmission line;

thereby providing that said buffer circuit may propagate a signal from said first transmission line to said second transmission line, may propagate a signal from said second transmission line to said first transmission line and may provide a high impedance to said first and second transmission lines when neither said first means nor said second means are operative to connect said first transmission line to said second transmission line.

19. An array of transmission lines in which said transmission lines are located in groups within said array, and within each said group at least one of said transmission lines employs three-state bidirectional buffer circuits and at least one of said transmission lines does not employ said three-state bidirectional buffer circuits comprising:

a buffer having an input terminal and an output terminal;

first means for selecting between a first state in which said input terminal of said buffer is connected to said first transmission line and said output terminal of said buffer is connected to said second transmission line and a second state in which said input terminal of said buffer is connected to said second transmission line and said output terminal of said buffer is connected to said first transmission line; and second means for selecting between one of said first and second states as selected by said first means for selecting and a third state in which said buffer is in a high impedance state;

thereby providing that said buffer circuit may propagate a signal from said first transmission line to said second transmission line, may propagate a signal from said second transmission line to said first transmission line and may provide a high impedance to said first and second transmission lines when said second means selects said third state.

* * * * *